United States Patent
Zamir et al.

(10) Patent No.: US 11,190,219 B1
(45) Date of Patent: Nov. 30, 2021

(54) DECODER FOR IRREGULAR ERROR CORRECTING CODES

(71) Applicant: Western Digital Technologies, Inc., San Jose, CA (US)

(72) Inventors: Ran Zamir, Ramat Gan (IL); Dudy Avraham, Tel Aviv (IL); Eran Sharon, Rishon Lezion (IL); Idan Alrod, Herzliya (IL); Idan Goldenberg, Ramat Hasharon (IL); Omer Fainzilber, Even-Yehuda (IL); Yuri Ryabinin, Beer-Sheva (IL); Yan Dumchin, Beer-Sheva (IL); Igal Mariasin, Beer-Shiva (IL); Eran Banani, Meitar (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/917,870

(22) Filed: Jun. 30, 2020

(51) Int. Cl.
*G11C 29/00* (2006.01)
*H03M 13/37* (2006.01)
*H03M 13/00* (2006.01)
*G06F 11/10* (2006.01)

(52) U.S. Cl.
CPC ..... *H03M 13/3707* (2013.01); *G06F 11/1068* (2013.01); *H03M 13/616* (2013.01)

(58) Field of Classification Search
CPC ............ H03M 13/3707; H03M 13/616; G06F 11/1068
See application file for complete search history.

(56) References Cited

U.S. PATENT DOCUMENTS

| | | | |
|---|---|---|---|
| 2007/0011564 A1* | 1/2007 | Kons | H03M 13/6561 714/758 |
| 2017/0093428 A1* | 3/2017 | Yen | H03M 13/658 |

* cited by examiner

*Primary Examiner* — Samir W Rizk
(74) *Attorney, Agent, or Firm* — Kunzler Bean & Adamson, PC

(57) ABSTRACT

An error correcting code (ECC) decoder for a non-volatile memory device is configured to decode data stored by the non-volatile memory device using a parity check matrix with columns of different column weights. The ECC decoder is further configured to artificially slow processing of one or more of the columns of the parity check matrix in response to column weights for the one or more columns satisfying a threshold.

20 Claims, 8 Drawing Sheets

DECODER FOR IRREGULAR ERROR CORRECTING CODES

TECHNICAL FIELD

The present disclosure, in various embodiments, relates to error correction and more particularly relates to a decoder for irregular low-density parity-check (LDPC) codes.

BACKGROUND

Irregular LDPC error correction codes can be useful, offering increased correction capabilities and decreased decoding latency. However, due to the disparate column weights of irregular LDPC codes, they can cause spikes in decoder power consumption, making decoder design more complex and operation less efficient.

SUMMARY

Apparatuses are presented for a decoder for irregular error correcting codes. An error correcting code (ECC) decoder for a non-volatile memory device, in certain embodiments, is configured to decode data stored by the non-volatile memory device using a parity check matrix with columns of different column weights. In one embodiment, an ECC decoder is configured to artificially slow processing of one or more of the columns of the parity check matrix in response to column weights for the one or more columns satisfying a threshold.

Additional apparatuses are presented for a decoder for irregular error correcting codes. In one embodiment, an apparatus includes means for reading data stored by a non-volatile memory device. An apparatus, in a further embodiment, includes means for processing a first set of columns of a low-density parity-check code matrix for the data at a first speed. In some embodiments, an apparatus includes means for processing a second set of columns of the matrix for the data at a slower speed than the first speed. A second set of columns, in one embodiment, has higher column weights than the first set of columns. The slower speed, in certain embodiments, is selected to maintain a peak to average power ratio below a power threshold.

Methods are presented for a decoder for irregular error correcting codes. A method, in one embodiment, includes reading data stored by a non-volatile memory device. In a further embodiment, a method includes processing a first set of columns of a parity check matrix for the data at a first speed. A method, in certain embodiments, includes processing a second set of columns of the parity check matrix for the data at a slower speed than the first speed. The second set of columns, in some embodiments, has higher column weights than the first set of columns.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
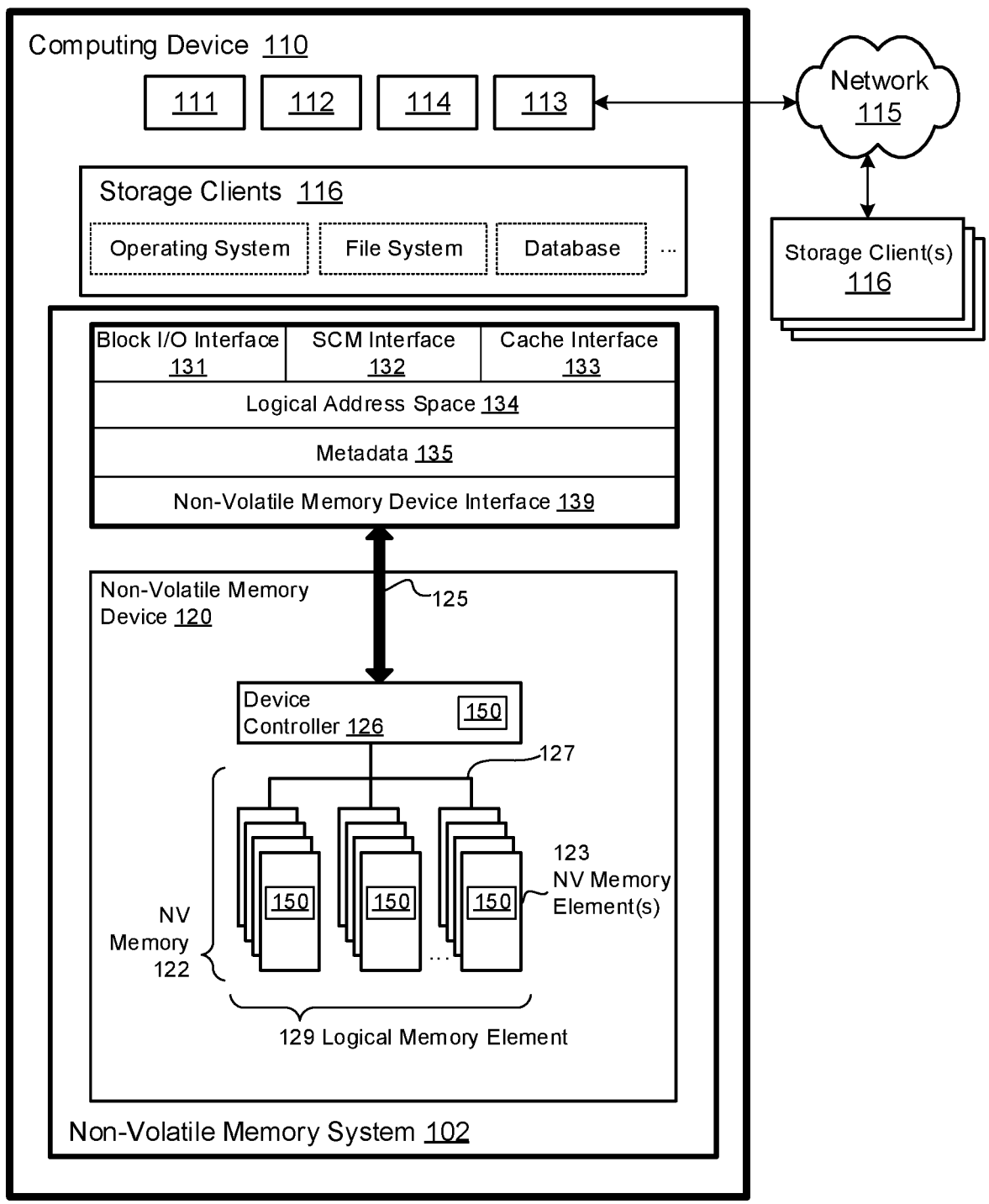
FIG. 1 is a schematic block diagram illustrating one embodiment of a system for a decoder for irregular error correcting codes.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "component," "module," "apparatus," or "system." Furthermore, aspects of the present disclosure may take the form of a computer program product embodied in one or more non-transitory computer readable storage media storing computer readable and/or executable program code.

A component, as used herein, comprises a tangible, physical, non-transitory device. For example, a component may be implemented as a hardware logic circuit comprising custom VLSI circuits, ASICs, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like.

A circuit, or circuitry, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include an integrated circuit, a portion of an integrated circuit, a set of integrated circuits, a set of non-integrated electrical and/or electrical components with or without integrated circuit devices, or the like. In one embodiment, a circuit may include custom VLSI circuits, ASICs, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to flowcharts and/or schematic block diagrams of methods, apparatuses, systems, and computer program products according to embodiments of the disclosure. It will be understood that each block of the flowcharts and/or schematic block diagrams, and combinations of blocks in the flowcharts and/or schematic block diagrams, can be implemented by computer program instructions. These computer program instructions may be provided to a processor of a computer or other programmable data processing apparatus to produce a machine, such that the instructions, that execute via the processor or other programmable data processing apparatus, create means for implementing the functions and/or acts specified in the flowcharts and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, that form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 depicts one embodiment of a system 100 for an error correcting code (ECC) component 150 for irregular error correcting codes for a non-volatile memory device 120. One or more ECC components 150 may be part of and/or in communication with one or more non-volatile memory elements 123, a memory device controller 126 external to the non-volatile memory elements 123, a device driver, or the like. One or more ECC components 150 may be part of a non-volatile memory system 102 of a host computing device 110, that may comprise a processor 111, volatile memory 112, and a communication interface 113.

In general, the ECC component 150 is configured to determine redundant information for a data set (e.g., a codeword) to store with the data set and to use the redundant information to detect and/or correct one or more errors in the data set (e.g., when the data set is subsequently read). For example, in certain embodiments, the ECC component 150 may use a parity check matrix to decode data stored by the non-volatile memory device 120 (e.g., a low-density parity-check (LDPC) code, or the like).

In one embodiment, the ECC component 150 is configured to decode data using an irregular parity check matrix (e.g., an irregular LDPC code, or the like). An irregular parity check matrix may have columns of different column weights (e.g., check nodes and/or variable nodes with different degrees). A column weight, as used herein, comprises a number of binary ones in a matrix column. In some embodiments, a column weight may determine a number of parity check equations that the data bit associated with the column participates in during processing of the column.

While, in certain embodiments, the use of an irregular parity check matrix with columns of different column weights, variable nodes of different degrees, and/or check nodes of different degrees may have various benefits, such as improved correction capability and decreased decoding latency, or the like, processing of columns with higher column weights may require more calculations and cause spikes in power consumption (e.g., due to the higher number of parity check equations for processing of columns with higher column weights, or the like). The ECC component 150, in one embodiment, may be configured to ensure that peak to average power consumption does not exceed a power threshold (e.g., reduce and/or eliminate spikes in power consumption) by artificially slowing or otherwise throttling processing of one or more columns of a parity check matrix with column weights that satisfy a threshold (e.g., higher column weights, column weights above a threshold, column weights greater than or equal to a threshold, or the like).

For example, the ECC component 150, instead of processing columns with column weights that satisfy a threshold in a single clock cycle or the like, the ECC component 150 may artificially slow processing of the column by only using a subset of available processing units (e.g., while the others remain idle), may reduce a number of messages calculated per bit per clock cycle for the column, may encode data in a manner that spreads processing of the columns, may wait a number of clock cycles without processing a column, may reschedule processing of the columns to process other columns between them, may temporally distribute processing of the columns to different processing units (e.g., with processing units between them processing other columns), may break up processing of the columns into subprocess and execute the subprocesses during different clock cycles, or the like.

In this manner, in certain embodiments, the ECC component 150 may provide the benefits of an irregular parity check matrix, while managing spikes in power consumption to provide substantially constant and/or level power consumption (e.g., so that peak to average power consumption does not exceed a power threshold, or the like). Reducing and/or eliminating spikes in power consumption, in some embodiments, may simplify design of the ECC component 150 and/or the non-volatile memory device 120, may cause more efficient operation of the ECC component 150 and/or the non-volatile memory device 120 (e.g., allow for a higher clock frequency, reduce power requirements, and/or reduce manufacturing/component costs), or the like.

The ECC component 150, in one embodiment, comprises an LDPC encoder and/or decoder. In other embodiments, the ECC component 150 may comprise use another type of error correcting code, such as Reed-Solomon code, Golay code, Bose Chaudhuri Hocquenghem (BCH) code, turbo code, multidimensional parity code, Hamming code, Hadamard code, expander code, Reed-Muller code, Viterbi code, Fano code, repetition code, parity code, cyclic code, polynomial code, Goppa code, expander code, Toric code, or the like. An LDPC code ECC decoder, as used herein, comprises an ECC decoder using a parity check matrix or other data structure to detect and/or correct one or more errors. In certain embodiments, an LDPC code decoder may be constructed or represented as a sparse bipartite graph, with variable nodes and check nodes. A codeword, as used herein, comprises a data set or other amount of data upon which an ECC encoder and/or an ECC decoder operates to correct data. A codeword may have a fixed size (e.g., for block codes or concatenated convolutional codes), a constraint length (e.g., for convolutional codes), or the like.

The processor 111 may comprise one or more central processing units, one or more general-purpose processors, one or more application-specific processors, one or more virtual processors (e.g., the host computing device 110 may be a virtual machine operating within a host), one or more processor cores, or the like. The communication interface 113 may comprise one or more network interfaces configured to communicatively couple the host computing device 110 and/or memory device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the host computing device 110. In one embodiment, the non-volatile memory device 120 comprises one or more non-volatile memory elements 123, such as semiconductor chips or packages or other integrated circuit devices coupled to one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the host computing device 110, installed in a port and/or slot of the host computing device 110, installed on a different host computing device 110 and/or a dedicated storage appliance on the network 115, in communication with the host computing device 110 over an external bus (e.g., an external hard drive), or the like.

The non-volatile memory device 120, in one embodiment, may be coupled to a memory bus of a processor 111 (e.g., on the same memory bus as the volatile memory 112, on a different memory bus from the volatile memory 112, in place of the volatile memory 112, or the like). In a further embodiment, the non-volatile memory device 120 may be coupled to a peripheral bus of the host computing device 110, such as a peripheral component interconnect express (PCI Express or PCIe) bus, a Serial Advanced Technology Attachment (SATA) bus, a Parallel Advanced Technology Attachment (PATA) bus, a Small Computer System Interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be coupled to a data network 115, such as an Ethernet network, an Infiniband network, SCSI RDMA over a network 115, a Storage Area Network (SAN), a Local Area Network (LAN), a Wide Area Network (WAN) such as the Internet, another wired and/or wireless network 115, or the like.

The host computing device 110 may further comprise a non-transitory, computer readable storage medium 114. The computer readable storage medium 114 may comprise executable instructions configured to cause the host computing device 110 (e.g., processor 111) to perform steps of one or more of the methods disclosed herein. Alternatively, or in addition, the ECC component 150 may be embodied as one or more computer readable instructions stored on the non-transitory storage medium 114.

In one embodiment, an ECC component 150 may include logic circuitry of one or more non-volatile memory devices 120, such as a memory device controller 126, a non-volatile memory element 123, other programmable logic, firmware for a non-volatile memory element 123, microcode for execution by a non-volatile memory element 123, or the like. In another embodiment, an ECC component 150 may include executable software code, stored on a computer readable storage medium 114 for execution by logic circuitry of a host computing device 110, a memory device controller 126, and/or a non-volatile memory element 123. In a further embodiment, an ECC component 150 may include a combination of both executable software code and logic circuitry.

In one embodiment, the non-volatile memory device 120 is configured to receive storage requests from a device driver or other executable application via buses 125, 127, a memory device controller 126, or the like. The non-volatile memory device 120 may be further configured to transfer data to/from a device driver and/or storage clients 116 via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the non-volatile memory device 120 may receive storage requests as an API call from a storage client 116, as an IO-CTL command, or the like.

According to various embodiments, a memory device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the memory device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), a cache line address, a memory address, a cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical-to-physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the host computing device 110 and/or remote, storage clients 116 accessible via the network 115 and/or network interface 113. The storage clients 116 may include, but are not limited to: operating systems, file systems, database applications, server applications, kernel-level processes, user-level processes, applications, or the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective memory device controllers 126 and non-volatile memory media 122. A device driver may provide access to the one or more non-volatile memory devices 120 via a traditional block I/O interface 131. Additionally, a device driver may provide access to enhanced functionality through the storage class memory (SCM) interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more memory device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, that may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, a fabric, Infiniband, Ethernet, Omnipath, GenZ, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the host computing device 110 and/or the memory device controller 126 to a network 115 and/or to one or more remote, network-accessible storage clients 116. The storage clients 116 may include local storage clients 116 operating on the host computing device 110 and/or remote, storage clients 116 accessible via the network 115 and/or the network interface 113. The memory device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, that may include but is not limited to: Resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM) such as one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory 122 is referred to herein as a "memory medium," in various embodiments, the non-volatile memory 122 may more generally comprise one or more non-volatile recording media capable of recording data, that may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory 122 may comprise one or more non-volatile memory elements 123, that may include, but are not limited to: chips, packages, planes, die, or the like. A memory device controller 126, external to the one or more non-volatile memory elements 123, may be configured to manage data operations on the non-volatile memory 122, and may comprise one or more processors, programmable processors (e.g., FPGAs), ASICs, micro-controllers, or the like. In some embodiments, the memory device controller 126 is configured to store data on and/or read data from the non-volatile memory 122, to transfer data to/from the non-volatile memory device 120, and so on.

The memory device controller 126 may be communicatively coupled to the non-volatile memory 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the memory device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The memory device controller 126 may comprise and/or be in communication with a device driver executing on the host computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, that may provide other storage services to the storage clients 116. In some embodiments, the SCM interface 132 may comprise extensions to the block device interface 131 (e.g., storage clients 116 may access the SCM interface 132 through extensions or additions to the block device interface 131).

Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the memory device controller 126 over a bus 125, as described above.

Figure 2:
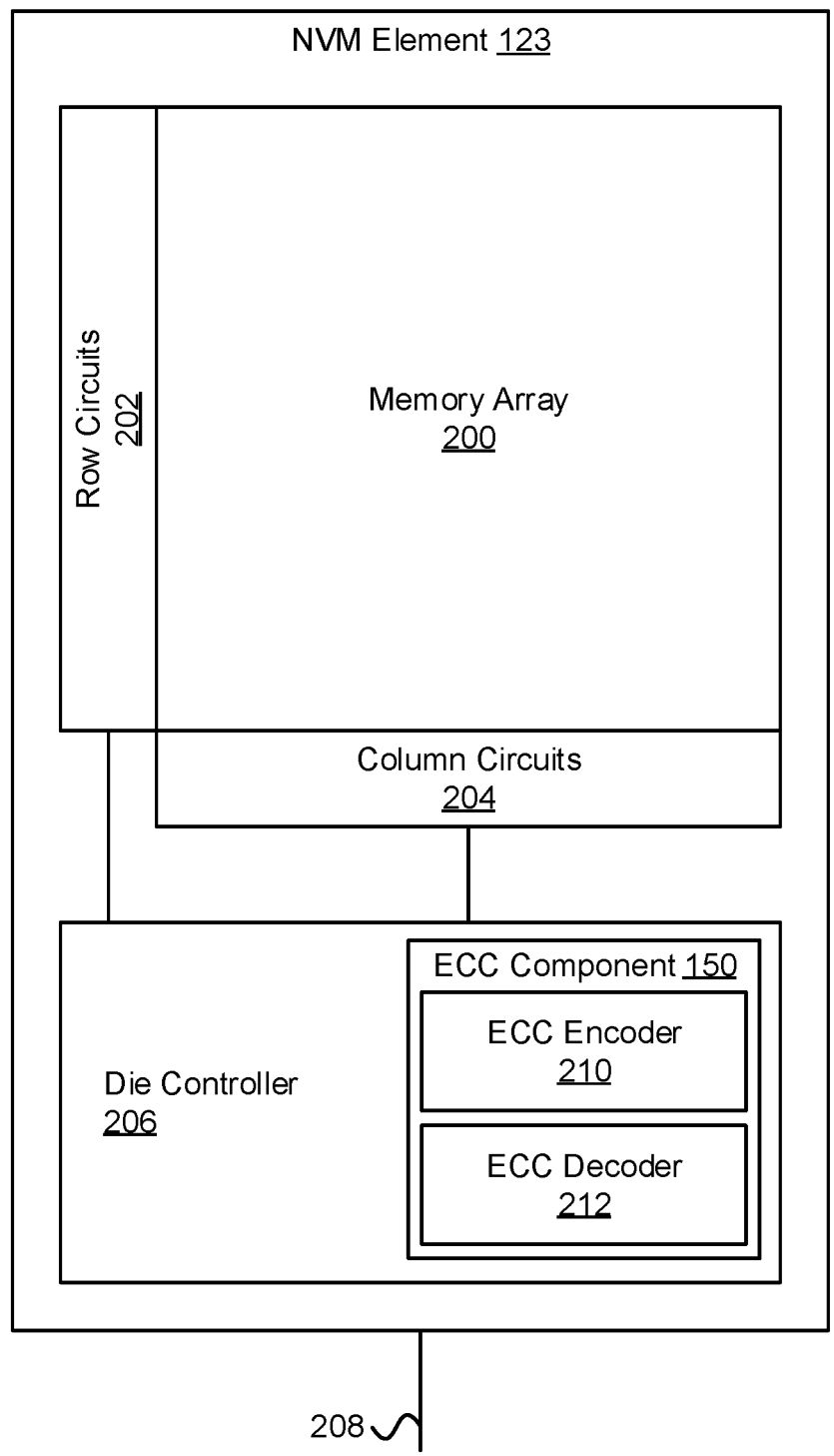
FIG. 2 is a schematic block diagram illustrating one embodiment of a non-volatile memory element comprising an ECC component.

FIG. 2 depicts one embodiment of a non-volatile memory element 123. The non-volatile memory element 123 may be substantially similar to the non-volatile memory element 123 described above with regard to FIG. 1. The non-volatile memory element 123, in the depicted embodiment, includes a memory array 200, row circuits 202, column circuits 204, and a die controller 206 that includes an ECC component 150.

In various embodiments, a non-volatile memory element 123 may be an integrated circuit (e.g., a chip or die) that includes both a core memory array 200 for data storage, and peripheral components (e.g., row circuits 202, column circuits 204, and/or a die controller 206) for communicating with the array 200. In certain embodiments, one or more non-volatile memory elements 123 may be included in a memory module, a storage device, or the like. Although a non-volatile memory element 123 including an array 200 of non-volatile memory cells is depicted, the disclosure is not limited in this regard. In another embodiment, a system may include one or more memory dies, that may be integrated circuits including one or more volatile and/or non-volatile memory arrays 200, that in turn may include volatile and/or non-volatile memory cells.

An ECC component 150 may comprise an ECC encoder 210 configured to encode data for storage in the memory array 200 and/or an ECC decoder 212 configured to decode the data, and that when decoding, may artificially slow processing of columns of a parity check matrix with column weights that satisfy a threshold in order to reduce or eliminate spikes in power consumption. An ECC decoder 212, as used herein, comprises logic circuitry and/or a software component, configured to use redundancy information defined for a data set (e.g., an ECC codeword) to detect and/or correct one or more errors in the data set.

In the depicted embodiment, the memory array 200 includes a plurality of non-volatile memory cells for storing data. In one embodiment, the array 200 may be a two-dimensional array. In another embodiment, the array 200 may be a three-dimensional array that includes multiple planes and/or layers of non-volatile memory cells. Memory cells, in various embodiments, may be the individual physical units of data storage for a memory array 200, such as floating gate transistors for Flash memory, magnetic tunnel junctions for MRAM memory, resistors with changeable resistance for ReRAM, capacitors for DRAM, or the like. In various embodiments, the array 200 may be addressable by rows via row circuits 202, and by columns via column circuits 204.

The die controller 206, in the depicted embodiment, is part of and/or coupled to the same non-volatile memory element 123 or memory die as the array 200. By contrast, a memory device controller 126 as described above with reference to FIG. 1, may be external to a non-volatile memory element 123 or memory die, and may communicate with a set of one or more non-volatile memory elements 123 or memory dies to read and write data.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, or the like. The die controller 206 may communicate with a host computing device 110, a processor 115, a bus controller, a memory device controller 126, a memory module controller, or the like, via bus 208, to receive command and address information, transfer data, or the like.

In certain embodiments, word lines couple row circuits 202 to rows of cells, and bit lines couple column circuits 204 to columns of cells. Thus, in one embodiment, to write data to a row of the array 200, the die controller 206 may use row circuits 202 to apply write pulses or a write voltage to a word line, and may use column circuits 204 to apply program or inhibit voltages to bit lines for cells in the row, corresponding to writing a 0 or a 1 to the cells. In a further embodiment, to read data from a row of the array 200, the die controller 206 may use row circuits 202 to apply read pulses or a read voltage to a word line and may use column circuits 204 to sense voltages or currents at bit lines for cells in the row, to determine what data is stored. Various other or further ways of writing or reading data to or from cells in rows, columns, planes, and/or other units of an array 200 will be clear. The term "word line" may be used herein to refer to a conductor that couples cells to row circuits 202, or to the cells that are coupled to the conductor. Similarly, the term "bit line" may be used herein to refer to a conductor that couples cells to column circuits 204, or to the cells that are coupled to the conductor.

In the depicted embodiment, the die controller 206 includes an ECC component 150, that may be substantially similar to the ECC components 150 described above with regard to FIG. 1. In certain embodiments, the die controller 206 may write data to the array 200, or read data from the array 200, and the ECC component 150 may encode the write data with redundant ECC information (e.g., using the ECC encoder 210) and may use the redundant ECC information to decode the read data (e.g., using the ECC decoder 212), to detect and/or correct one or more errors in the data.

In various embodiments, artificially slowing processing of columns with column weights that satisfy a threshold (e.g., higher column weights) may be performed by an ECC component 150 of a die controller 206 for a volatile or non-volatile memory element 123, and/or may be done by an ECC component 150 of a device driver or memory device controller 126 for a non-volatile memory device 120. In another embodiment, an ECC component 150 may include portions of a device driver, a memory device controller 126, one or more die controllers 206, or the like.

In certain embodiments, the ECC component 150 uses a linear error correcting code (e.g., a block code, a convolutional code, a turb code, or the like) for forward error correction, encoding data into a codeword that is larger (e.g., uses more bits or other symbols) than the original data value being encoded, so that the ECC component 150 may detect and/or correct one or more subsequent data errors in the codeword. For example, in various embodiments, the ECC component 150 may use an LDPC code, Reed-Solomon code, Golay code, Bose Chaudhuri Hocquenghem (BCH) code, turbo code, multidimensional parity code, Hamming code, Hadamard code, expander code, Reed-Muller code, Viterbi code, Fano code, repetition code, parity code, cyclic code, polynomial code, Goppa code, expander code, Toric code, or the like.

The ECC component 150, in one embodiment, decodes data using a parity-check matrix (e.g., an LDPC code, a Hamming code, or the like). A parity check matrix may describe linear relations that components of a codeword satisfy, allowing the ECC decoder 212 of the ECC component 150 to detect and/or correct errors in the codeword. Rows of a parity check matrix, in some embodiments, may be coefficients of parity check equations, so each binary one value in a column of a parity check matrix may indicate how many parity check equations the column is a part of during processing of the column. The ECC decoder 212 may use a generator matrix of the associated code to determine the parity check matrix, may generate a parity-check matrix randomly, or the like.

In some embodiments, the ECC decoder 212 may use soft decision information (e.g., a soft-in-soft-out technique or the like) to perform a single parity check (e.g., row and/or check node processing) and an iterative cross checking process (e.g., column and/or variable node processing) which are repeated (e.g., flipping bits based on unsatisfied check nodes, or the like) until the valid codeword is decoded. The ECC decoder 212 may pass messages (e.g., soft information) between the columns/variable nodes and rows/check nodes indicating probabilities, likelihoods, log-likelihood ratios, or the like. The ECC decoder 212 may test, check, and/or validate each potential result by multiplying it by the parity-check matrix until the result is zeroes (e.g., all parity check equations are satisfied).

Processing a column, in one embodiment, comprises the ECC decoder 212 updating an estimate of a bit being decoded (e.g., a bit associated with the column/variable node being processed), and may be based on one or more messages from the rows/check nodes to the column/variable node. The ECC decoder 212, in response to processing a column/variable node, may send one or more messages back to one or more rows/check nodes. Column processing, as described above, may consume more power, may be more processor intensive, or the like the greater the column weight (e.g., number of binary ones in the column).

The ECC decoder 212, in one embodiment, processes multiple columns in parallel, on multiple processing units of the die controller 206 and/or ECC component 150. A processing unit, as used herein, comprises logic circuitry capable of processing a column (e.g., a processor, processor core, microprocessor, graphical processing unit, coprocessor, ECC specific circuitry, a lookup table, a gate array or other programmable logic, and/or other logic circuitry). A processing unit may be embedded in a die controller 206, a memory device controller 126, may comprise a processor 111 disposed on and/or coupled to a host computing device 110, or the like. The ECC decoder 212, for example, may process one column per clock cycle per processing unit for columns with column weights that fail to satisfy a threshold (e.g., lower column weights) and may artificially slow processing of columns with column weights that do satisfy the threshold (e.g., higher column weights).

Figure 3:
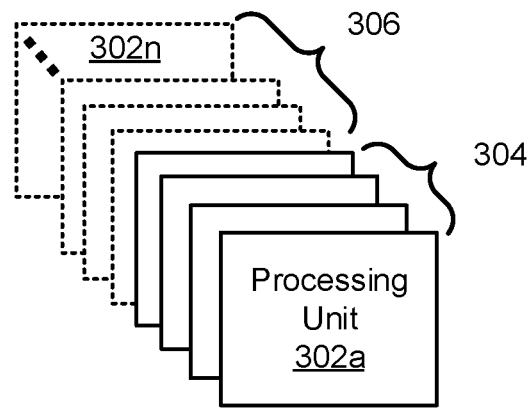
FIG. 3 is a schematic block diagram illustrating one embodiment of processing units of an ECC decoder for processing columns of a parity check matrix.

FIG. 3 depicts one embodiment of processing units 302a-n for processing columns of a parity check matrix. As described above, processing units 302a-n may be part of and/or in communication with an ECC component 150, an ECC encoder 210, an ECC decoder 212, a memory device controller 126, a die controller 206, a device driver, or the like.

In the depicted embodiment, the ECC decoder 212 is configured to artificially slow processing of one or more columns of a parity check matrix (e.g., high column weight columns with column weights that satisfy a threshold) by using only a first subset 304 of available processing units 302a-n for processing the one or more columns, while a second subset 306 remains idle (e.g., to conserve power, to ensure power consumption and/or a peak-to-average power ratio remains below a power threshold, or the like). The ECC decoder 212 may use all available processing units 302a-n for processing columns that fail to satisfy the threshold (e.g., low column weight columns).

By only using a subset 304 of available processing units 302a-n, in some embodiments, the ECC decoder 212 may split the processing of bits with high column weights (e.g., column weights that satisfy a threshold) over multiple clock cycles. For example, a subset 304 of the processing units 302a-n may not have enough processing capacity (e.g., time and/or processing power) to process each column with a column weight that satisfies the threshold in a single clock cycle, and the ECC decoder 212 may split and/or spread processing of the columns across multiple clock cycles, using only a subset 304 of available processing units 302a-n.

In certain embodiments, the ECC decoder 212 dynamically selects a number of processing units 302a-n to use (e.g., a size of a subset 304 of the processing units 302a-n) based on a column weight of the columns being processed. For example, the ECC decoder 212 may use multiple thresholds (e.g., using one quarter of the processing units 302a-n for columns with column weights satisfying a highest threshold, using one half of the processing units 302a-n for columns with column weights satisfying an intermediate threshold, using three quarters of the processing units 302a-n for columns with column weights satisfying a lowest threshold, using all available processing units 302a-n for columns with column weights that fail to satisfy any of the thresholds, or the like). By dynamically scaling the number of processing units 302a-n in the subset 304 used to process columns of various column weights in a fine grained manner, in some embodiments, the ECC decoder 212 may consume a substantially stable amount of power (e.g., maintain power consumption, peak-to-average power ratio, or the like for decoding below a power threshold).

Figure 4:
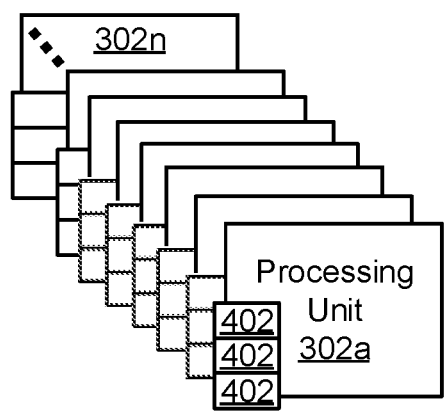
FIG. 4 is a schematic block diagram illustrating a further embodiment of processing units for processing columns of a parity check matrix.

FIG. 4 depicts a further embodiment of processing units 302a-n for processing columns of a parity check matrix. In the depicted embodiment, instead of or in addition to using only a subset 304 of the processing units 302a-n as described above with regard to FIG. 3, the ECC decoder 212 is configured to artificially slow processing of one or more columns with column weights that satisfy a threshold by reducing a number of messages 402 (e.g., messages 402 from a check node or row to a column or variable node, or the like) calculated per bit per clock cycle for the one or more columns (e.g., when compared to a number of messages calculated per bit per clock cycle for other columns with column weights that fail to satisfy the same threshold).

For example, the ECC decoder 212 may utilize all available processing units 302a-n, but not at their full processing capacity in order to avoid spike in power consumption, peak-to-average power ratio, or the like, artificially limiting the number of messages 402 each processing unit 302a-n processes per clock cycle to spread the processing of messages 402 for high column weight columns across multiple clock cycles, more clock cycles than for lower column weight columns, or the like. In other embodiments, the ECC decoder 212 may subdivide and/or break column processing into other subprocesses, instead of or in addition to breaking processing up by messages 402 for high column weight columns. In certain embodiments, columns with higher column weights receive more messages 402 for processing, as the column weight represents the number of binary ones in the column, indicating the number of rows, check nodes, and/or edges associated with the column.

Figure 5:
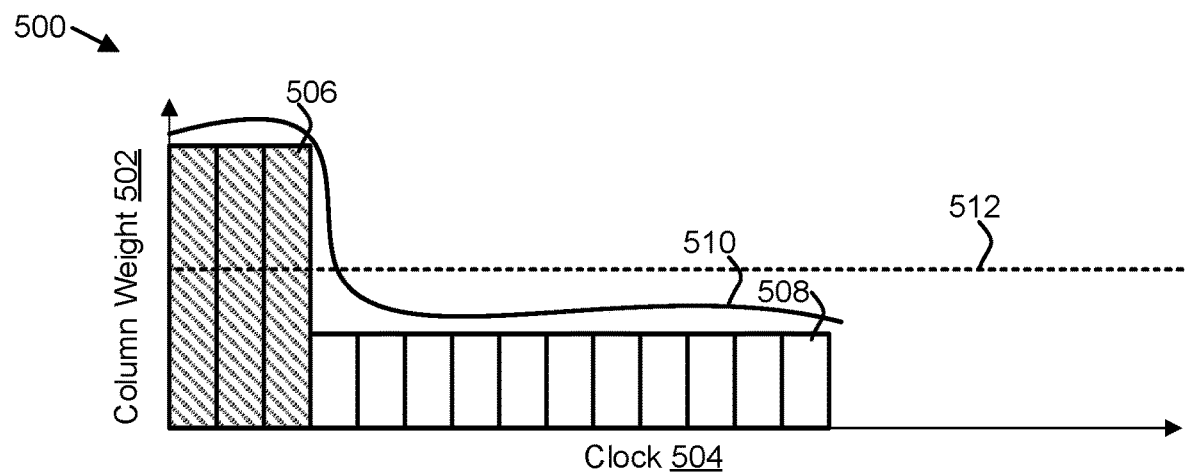
FIG. 5 is a graph illustrating one embodiment of power consumption for processing columns of a parity check matrix over time.

FIG. 5 is a graph 500 depicting one embodiment of power consumption 510 for processing columns 506, 508 of a parity check matrix over time 504 (e.g., per clock cycle 504). In the depicted embodiment, processing units 302a-n each process one column 506, 508 per clock cycle 504, regardless of whether the columns 506, 508 are high column weight columns 506 (e.g., with column weights 502 that satisfy a threshold) or low column weight columns 508 (e.g., with column weights 502 that fail to satisfy a threshold).

Because, in the graph 500 of FIG. 5, columns 506, 508 are processed the same, without regard to column weight 502, high column weight 502 columns 506 cause a spike in power consumption 510, above a power threshold 512. This uneven power consumption 512, in certain embodiments, may complicate design and/or operation of the ECC decoder 212, the non-volatile memory device 120, or the like.

Figure 6:
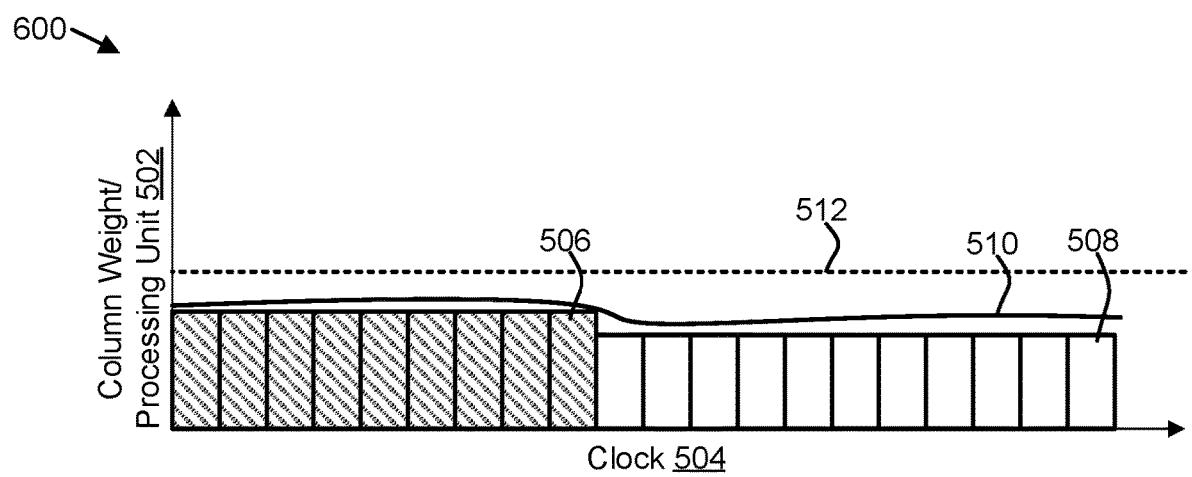
FIG. 6 is a graph illustrating one embodiment of power consumption for processing columns of a parity check matrix by column weight over time.

FIG. 6 is a graph 600 depicting one embodiment of power consumption 510 for processing columns 506, 508 of a parity check matrix by column weight 502 over time 504 (e.g., per clock cycle 504). In the embodiment depicted in the graph 600, the ECC decoder 212 has broken up processing of high column weight 502 columns 506 into subprocesses, messages, or the like to spread and/or split processing of the high column weight 502 columns 506 across additional clock cycles 504. In this manner, the ECC decoder 212 maintains the power consumption 510 below a power threshold 512, with little or no spikes and substantially constant power consumption 510.

Breaking up processing of a single column 506 as subprocesses distributed and/or spread across multiple clock cycles 504 for execution, in some embodiments, may be referred to as schedule smoothing. A processing unit 302, in one embodiment, may internally execute multiple subprocesses during the same clock cycle 504 (e.g., processing multiple messages 402, a sum function, a compare function, updating data in a register, or the like). The ECC decoder 212 may break up subprocesses that would otherwise be executed during the same clock cycle 504 and execute them in different clock cycles 504 in response to a column 506 having a column weight 502 that satisfies a threshold.

In some embodiments, spreading out subprocesses may also reduce and/or eliminate sub-clock peaks in power consumption 510, when processing units 302 may otherwise all execute the same subprocess at about the same time by changing alignment of the subprocesses. In further embodiments, the ECC decoder 212 may skew timing for one or more of the processing units 302 to reduce and/or prevent sub-clock peaks in power consumption 510.

Figure 7:
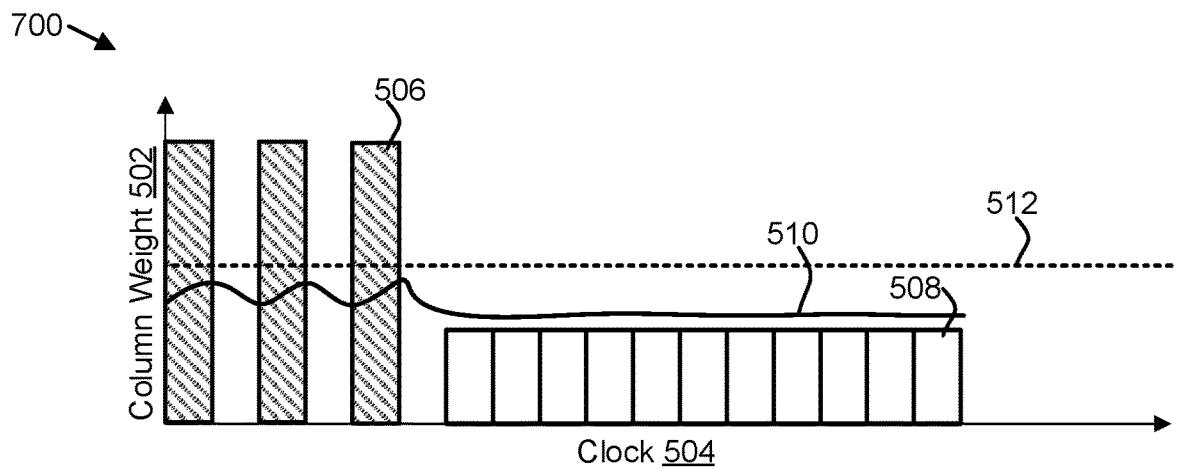
FIG. 7 is a graph illustrating one embodiment of power consumption for processing columns of a parity check matrix by column weight over time.

FIG. 7 depicts a graph 700 of one embodiment of power consumption 510 for processing columns of a parity check matrix by column weight 502 over time 504. In the depicted embodiment, the ECC decoder 212 is configured to selectively puncture one or more clock cycles 504 in response to a column weight for a column satisfying a threshold. The ECC decider 212 may artificially slow processing of a column (e.g., puncture the clock 504) by waiting a number of clock cycles without processing a column (e.g., pausing execution, halting execution, executing a no-op, scaling a frequency of the clock 504, buffering and/or delaying the clock 504, or the like). In this manner, in certain embodiments, the power consumption 510, peak-to-average power ratio, or the like may remain below the power threshold 512, as columns 506 with high column weights 502 are followed by punctured periods of lower power consumption 510.

In one embodiment, the column weights 502 of columns 506, 510 may be static and/or predefined, such that the ECC decoder 212 may use the column weights 502 to control puncturing of the clock signal 504, inserting delays for column weights 502 that satisfy a threshold. The ECC decoder 212, in some embodiments, is configured to dynamically select a number of clock cycles 504 of delay to puncture and/or insert based on a magnitude of the associated column weight 502 (e.g., inserting a longer delay and/or puncturing more clock cycles 504 in response to higher column weights 502, a shorter delay and/or puncturing fewer clock cycles 504 in response to lower column weights 502 that still satisfy the threshold, or the like).

Figure 8:
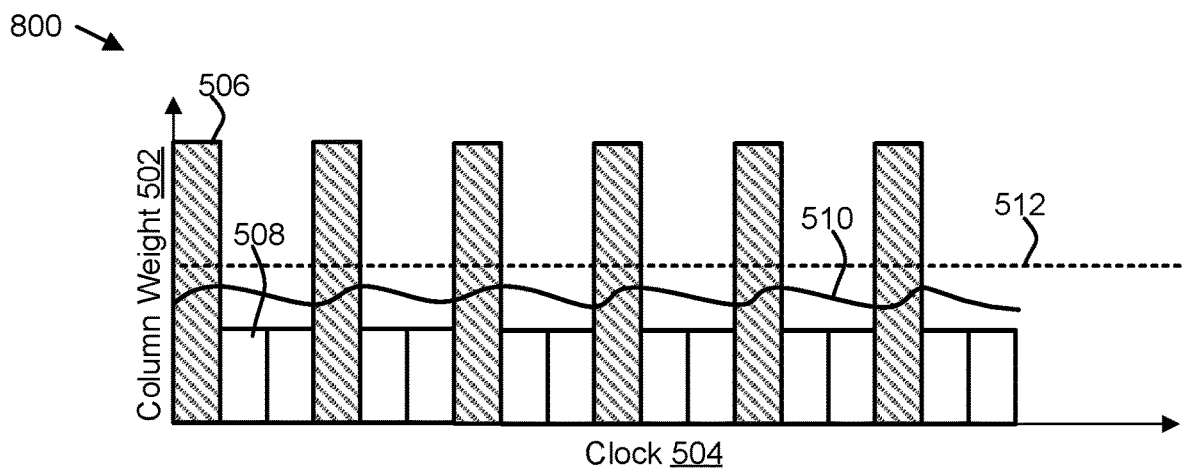
FIG. 8 is a graph illustrating a further embodiment of power consumption for processing columns of a parity check matrix by column weight over time.

FIG. 8 depicts a graph 800 of a further embodiment of power consumption 510 for processing columns 506, 508 of a parity check matrix by column weight 502 over time 504. In the depicted embodiment, instead of or in addition to clock puncturing, the ECC decoder 212 uses schedule spreading to artificially slow processing of columns 506 with column weights 502 that satisfy a threshold by rescheduling processing of the columns 506, interspersing them with other columns 508 that fail to satisfy the threshold, and have lower column weights 502 and therefore fewer calculations and lower power consumption 510. As used herein, a schedule of the ECC decoder 212 comprises an order in which the ECC decoder 212 processes columns 506, 508. Schedule spreading, as used herein, comprises adjusting or otherwise altering a schedule of the ECC decoder 212 (e.g., based on a column weight 502 of the columns 506, 508, in order to artificially slow processing of columns 506 with column weights 502 that satisfy a threshold, or the like).

In some embodiments, the ECC decoder 212 may freely reschedule and reorder processing of certain columns 506, 508. In other embodiments, certain processing operations may not be reordered, and the ECC decoder 212 may reschedule/reorder when possible, and insert delay/punctured clocks when rescheduling is not available, in order to ensure that power consumption 510 remains below a power threshold 512.

In some embodiments, an ECC encoder 210 may encode data without consideration of and/or constraints to the number and/or relative position of edges, and high column weight columns may be grouped and/or consolidated causing spikes in power consumption, or the like. In order to level power consumption, in certain embodiments, the ECC decoder 212 may use schedule spreading as described above, interleaving lower column weight columns 508 between processing of higher column weight columns 506, or the like.

In a further embodiment, the ECC encoder 210 is configured to enforce a maximum number of edges (e.g., binary ones in columns of the parity matrix, cumulative column weight, or the like) within a sliding window of clock cycles 504 as the ECC encoder 210 encodes data to be stored by non-volatile memory 122 of the non-volatile memory device 120, in order to provide an optimized schedule for the ECC decoder 212 or the like. By proactively enforcing one or more constraints at encode time, in certain embodiments, an ECC encoder 210 may artificially slow processing of columns by the ECC decoder 212 with high column weights in advance based on how the data is encoded.

For example, the ECC encoder 210 may use an iterative, greedy algorithm and may improve an efficiency of the code 800 over time, with each iteration, as the ECC encoder 210 is configured to only use codes 800 that maintain the power consumption 510 below the power threshold 512 or the like, inherently spreading high column weight columns 508 during code generation in a subsequent decoding schedule of the ECC decoder 212.

In certain embodiments, the ECC encoder 210 may generate an initial code 800 (e.g., randomly, pseudo-randomly, based on a seed value, based on one or more constraints, or the like) and may generate one or more subsequent codes by making iterative modifications and/or optimizations to the code 800 to enforce the maximum number of edges within the sliding window of clock cycles 504. The ECC encoder 210 may evaluate the different codes 800 and select the code 800 with the best power consumption 510 attributes (e.g., iterating and improving newly generated codes 800 until further iterations fail to improve the code 800, reduce/level the power consumption 510, or the like, in which case the final code 800 is optimized and used by the ECC encoder 210, or the like).

Figure 9:
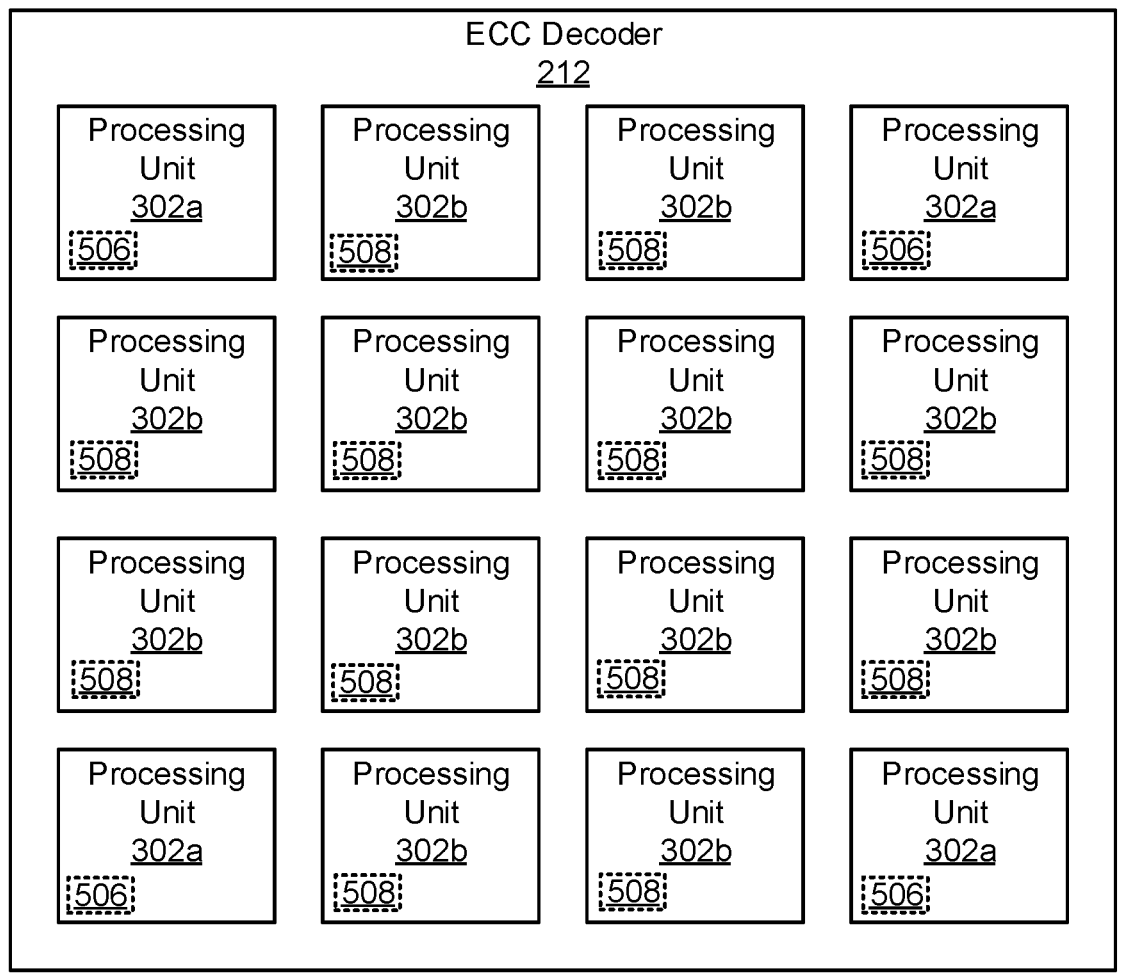
FIG. 9 is a schematic block diagram illustrating one embodiment of an ECC decoder with processing units for processing columns of a parity check matrix.

FIG. 9 depicts one embodiment of an ECC decoder 212 with processing units 302 of an ECC decoder 212 for processing columns 506, 508 of a parity check matrix. In some embodiments, the ECC decoder 212 is configured to temporally distribute processing of columns 506 with column weights that satisfy a threshold among the processing units 302a, with other columns 508 being processed on processing units 302b disposed therebetween. For example, in the depicted embodiment, columns 506 with high column weights are processed by processing units 302a in corners, while other columns 508 with lower column weights are processed by processing units 302b more toward the center of the ECC decoder 212.

By physically distancing processing of high column weight columns 508, in some embodiments, the ECC decoder 212 may reduce and/or eliminate local power spikes, more evenly distribute heat, or the like. For example, the different processing units 302a processing high column weight columns 506 may be coupled to different power sources, may have their power consumption offset and/or balanced by surrounding processing units 302b processing lower column weight columns 508, or the like. Minor timing differences in signals due to the physical distance between processing units 302a processing high column weight columns 506, in certain embodiments, may reduce or eliminate peaks in power consumption within a sub-clock cycle window by reducing overlap in sub-clock subprocesses due to timing offsets from the distance.

In embodiments with a quasi-cyclical LDPC architecture, each bit in the same Z-tuple may be connected to different check nodes and/or participate in a different set of parity check equations due to the circulant property provided by the use of a shifted unitary matrix of size Z×Z, or the like. In such an embodiment, separating the Z processing units 302a and compare logic 302a from update flip-flops and/or registers, while placing the processing units 302a apart from each other in the floor plan of the ECC decoder 212 and connecting them to the update flip-flops via a bus or the like, may spread the logic circuitry enough to avoid hot spots.

Figure 10:
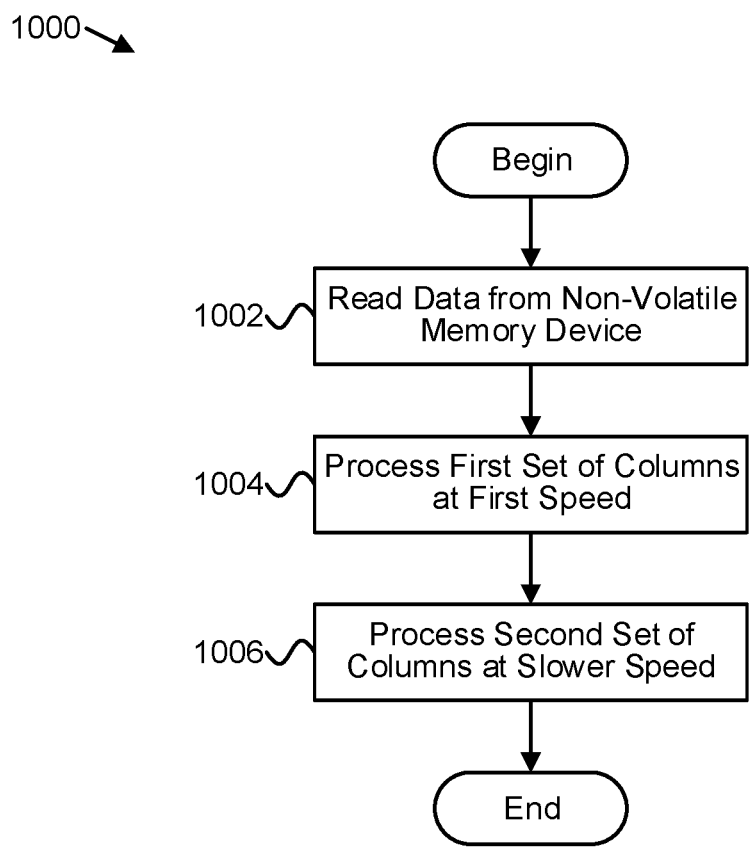
FIG. 10 is a flow chart illustrating one embodiment of a method for a decoder for irregular error correcting codes.

FIG. 10 depicts one embodiment of a method 1000 for a decoder for irregular error correcting codes. The method 1000 begins and a die controller 206 reads 1002 data stored by a non-volatile memory device 120.

An ECC decoder 212 processes 1004 a first set of columns 508 of a parity check matrix for the data at a first speed. The ECC decoder 212 processes 1006 a second set of columns 506 of the parity check matrix for the data (e.g., columns 506 having higher column weights 502 than the first set of columns 508) at a slower speed than the first speed, and the method 1000 ends.

Figure 11:
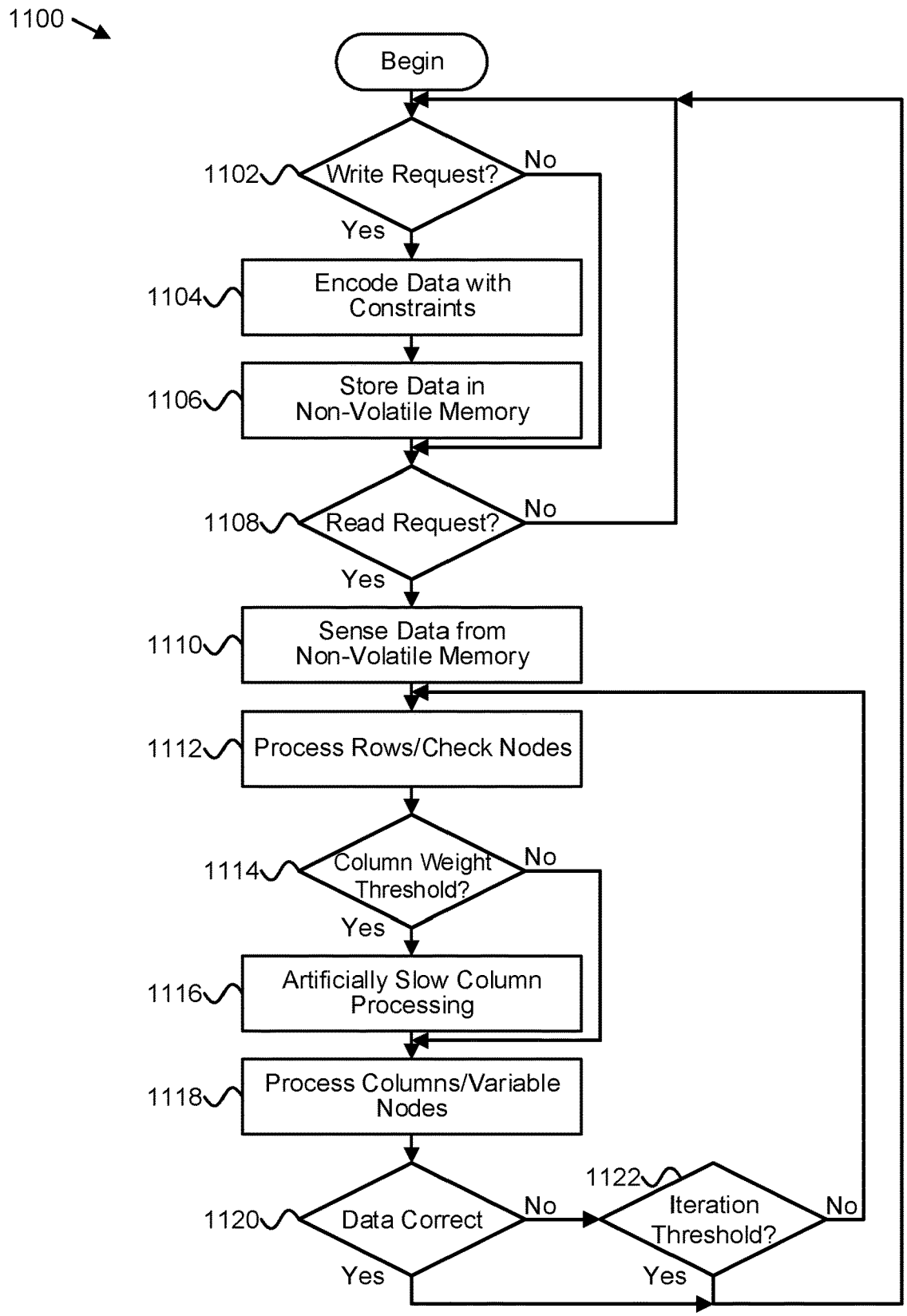
FIG. 11 is a flow chart illustrating a further embodiment of a method for a decoder for irregular error correcting codes.

FIG. 11 depicts one embodiment of a method 1100 for a decoder for irregular error correcting codes. The method 1100 begins, and a die controller 206 determines 1102 if a write request for data has been received. If the die controller 206 determines 1102 that a write request has been received, an ECC encoder 210 encodes 1104 the data while enforcing one or more constraints (e.g., using a predetermined code, or the like), such as a maximum number of edges in a window of clock cycles 504. The die controller 206 stores 1106 the encoded data in a non-volatile memory array 200.

The die controller 206 determines 1108 if a read request for data has been received. If the die controller 206 determines 1108 that a read request has been received, the die controller 206 senses 1110 the data from the non-volatile memory array 200 to read the data. An ECC decoder 212 processes 1112 one or more rows/columns and/or check nodes (e.g., updating the check nodes, processing messages, passing messages, or the like).

For a column to be processed, the ECC decoder 212 determines 1114 if the column satisfies a column weight threshold. If the column satisfies 1114 the column weight threshold, the ECC decoder 212 artificially slows 1116 processing of the column. The ECC decoder 212 processes 1118 each of the columns and/or variable nodes (e.g., updating variable nodes, processing messages, passing messages, artificially slowing 1116 processing of the columns 506 with column weights 502 that satisfy 1114 a column weight threshold, and the like).

The ECC decoder 212 determines 1120 whether the data is correct (e.g., by multiplying the corrected codeword by the parity check matrix, performing a syndrome check, or the like). If the ECC decoder 212 determines 1120 that the data is correct, the read request is completed and the method 1100 continues with subsequent write requests 1102 and/or read requests 1108.

If the ECC decoder 212 determines 1120 that the data is not yet correct, the ECC decoder 212 determines 1122 if a maximum iteration threshold has been reached. If the maximum iteration threshold has been reached, the ECC decoder 212 may abort the read operation, provide an error message and/or signal, flag the read as an uncorrectable error, forward the read to a device driver for further processing, or the like, and the method 1100 may continue. If the ECC decoder 212 determines 1122 that the maximum iteration threshold has not yet been reached, the method 1100 continues with another iteration of row/check node processing 1112, column/variable node processing 1118 (e.g., with high column weight columns 506 artificially slowed 1116) until either the data is correct 1120 or the maximum iteration threshold is reached 1122.

A means for reading data stored by a non-volatile memory device 120, in various embodiments, may include one or more of a device driver, a memory device controller 126, an on-die controller 206, row circuits 202, column circuits 204, a memory array 200, sense amplifiers, an ECC component 150, an ECC decoder 212, a processing unit 302, a processor 111, and/or other logic circuitry or executable code stored on a computer readable storage medium. Other embodiments may include similar or equivalent means for reading data stored by a non-volatile memory device 120.

A means for processing a first set of columns 508 of a low-density parity-check code matrix for data at a first speed, in various embodiments, may include one or more of a device driver, a memory device controller 126, an on-die controller 206, an ECC component 150, an ECC decoder 212, a processing unit 302, a processor 111, and/or other logic circuitry or executable code stored on a computer readable storage medium. Other embodiments may include similar or equivalent means for processing a first set of columns 508 of a low-density parity-check code matrix for data at a first speed.

A means for processing a second set of columns 506 of the matrix for the data at a slower speed than the first speed to maintain a peak to average power ratio below a power threshold, in various embodiments, may include one or more of a device driver, a memory device controller 126, an on-die controller 206, an ECC component 150, an ECC decoder 212, a processing unit 302, a processor 111, and/or other logic circuitry or executable code stored on a computer readable storage medium. Other embodiments may include similar or equivalent means for processing a second set of columns 506 of the matrix for the data at a slower speed than the first speed to maintain a peak to average power ratio below a power threshold.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. An apparatus comprising:
   a non-volatile memory device; and
   an error correcting code (ECC) decoder for the non-volatile memory device, the ECC decoder configured to:
      decode data stored by the non-volatile memory device using a parity check matrix with columns of different column weights, and
      process a first set of the columns of the parity check matrix at a first speed in response to column weights for the first set of columns failing to satisfy a threshold, and
      artificially slow processing of a second set of the columns of the parity check matrix to a slower speed than the first speed in response to column weights for the second set of columns satisfying the threshold.

2. The apparatus of claim 1, wherein the ECC decoder is configured to artificially slow processing of the second set of columns by using only a subset of available processing units to process the second set of columns such that one or more other processing units are idle.

3. The apparatus of claim 1, wherein the ECC decoder is configured to artificially slow processing of the second set of columns by reducing a number of messages calculated per bit per clock cycle for the second set of columns when compared to a number of messages calculated per bit per clock cycle for the first set of columns.

4. The apparatus of claim 1, further comprising an ECC encoder for the non-volatile memory device, the ECC encoder configured to encode the data stored by the non-volatile memory device by enforcing a maximum number of edges in a window of clock cycles such that the ECC decoder artificially slows the processing of the second set of columns of the parity check matrix in response to the column weights satisfying the threshold.

5. The apparatus of claim 1, wherein the ECC decoder is configured to artificially slow processing of the second set of columns by waiting a number of clock cycles without processing one of the columns in response to the second set of columns satisfying the threshold.

6. The apparatus of claim 5, wherein the number of clock cycles is selected based on the column weights for the second set of columns.

7. The apparatus of claim 1, wherein the ECC decoder is configured to artificially slow processing of the second set of columns by rescheduling processing of the second set of columns such that the ECC decoder is configured to process one or more columns of the first set of columns between the processing of the columns of the second set.

8. The apparatus of claim 1, wherein the ECC decoder is configured to temporally distribute processing of the second set of columns among processing units such that one or more columns of the first set of columns are processed by processing units disposed between processing units processing the second set of columns.

9. The apparatus of claim 1, wherein the ECC decoder is configured to artificially slow processing of the second set of columns by breaking the processing of the second set of columns into subprocesses and executing the subprocesses during different clock cycles.

10. The apparatus of claim 1, wherein the ECC decoder is configured to use a single clock cycle to process one or more columns of the first set of columns.

11. The apparatus of claim 1, wherein slowing processing of the second set of columns of the parity check matrix has a lower peak to average power ratio than using a single clock cycle to process the second set of columns of the parity check matrix.

12. A method comprising:
reading data stored by a non-volatile memory device;
processing a first set of columns of a parity check matrix for the data at a first speed; and
processing a second set of columns of the parity check matrix for the data at a slower speed than the first speed, the second set of columns having higher column weights than the first set of columns.

13. The method of claim 12, wherein the second set of columns is processed at a slower speed than the first speed by using only a subset of available processing units to process the second set of columns such that one or more other processing units are idle.

14. The method of claim 12, wherein the second set of columns is processed at a slower speed than the first speed by reducing a number of messages calculated per bit per clock cycle for the second set of columns compared to a number of messages calculated per bit per clock cycle for the first set of columns.

15. The method of claim 12, further comprising encoding the data for storage by the non-volatile memory device by enforcing a maximum number of edges in a window of clock cycles to slow the processing of the second set of columns of the parity check matrix.

16. The method of claim 12, wherein the second set of columns is processed at a slower speed than the first speed by waiting a number of clock cycles without processing a column of the parity check matrix.

17. The method of claim 12, wherein the second set of columns is processed at a slower speed than the first speed by rescheduling processing of the second set of columns such that one or more columns from the first set of columns are processed between the processing of columns of the second set of columns.

18. The method of claim 12, further comprising temporally distributing processing of the second set of columns among processing units such that one or more columns from the first set of columns are processed by processing units disposed between processing units processing the second set of columns.

19. The method of claim 12, wherein the second set of columns is processed at a slower speed than the first speed by breaking the processing of the second set of columns into subprocesses and executing the subprocesses during different clock cycles.

20. An apparatus comprising:
means for reading data stored by a non-volatile memory device;
means for processing a first set of columns of a low-density parity-check code matrix for the data at a first speed; and
means for processing a second set of columns of the matrix for the data at a slower speed than the first speed, the second set of columns having higher column weights than the first set of columns and the slower speed selected to maintain a peak to average power ratio below a power threshold.

* * * * *